US012652840B2

(12) United States Patent
Tolle et al.

(10) Patent No.: US 12,652,840 B2
(45) Date of Patent: Jun. 9, 2026

(54) METHODS OF FORMATION OF A SiGe/Si SUPERLATTICE

(71) Applicant: Applied Materials, Inc., Santa Clara, CA (US)

(72) Inventors: John Tolle, Gilbert, AZ (US); Thomas Kirschenheiter, Tempe, AZ (US); Joe Margetis, Gilbert, AZ (US); Patricia M. Liu, Saratoga, CA (US); Zuoming Zhu, Sunnyvale, CA (US); Flora Fong-Song Chang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 664 days.

(21) Appl. No.: 17/870,327

(22) Filed: Jul. 21, 2022

(65) Prior Publication Data

US 2023/0029344 A1     Jan. 26, 2023

Related U.S. Application Data

(60) Provisional application No. 63/225,268, filed on Jul. 23, 2021.

(51) Int. Cl.
*H10D 62/815*     (2025.01)
*H01L 21/02*     (2006.01)
*H10D 30/69*     (2025.01)

(52) U.S. Cl.
CPC ..... *H10D 62/8164* (2025.01); *H01L 21/0245* (2013.01); *H01L 21/02507* (2013.01);
(Continued)

(58) Field of Classification Search
CPC ............ H10D 62/8164; H10D 30/751; H10D 62/8171; H01L 21/0245; H01L 21/02507; H01L 21/02532; H01L 21/02381
See application file for complete search history.

(56) References Cited

U.S. PATENT DOCUMENTS 7,938,987 B2     5/2011   Grigorian et al.
8,598,062 B2    12/2013   Berkowitz et al.
(Continued)

FOREIGN PATENT DOCUMENTS

EP      0858101 A2     8/1998
JP      H06045257 A    2/1994
(Continued)

OTHER PUBLICATIONS

Japanese Office Action dated Nov. 5, 2024 for Application No. 2023-563941.
(Continued)

*Primary Examiner* — Michelle Mandala
(74) *Attorney, Agent, or Firm* — Patterson + Sheridan, LLP

(57) ABSTRACT
A method and apparatus for forming a super-lattice structure on a substrate is described herein. The super-lattice structure includes a plurality of silicon-germanium layers and a plurality of silicon layers disposed in a stacked pattern. The methods described herein produce a super-lattice structure with transition width of less than about 1.4 nm between each of the silicon-germanium layers and an adjacent silicon layer. The methods described herein include flowing one or a combination of a silicon containing gas, a germanium containing gas, and a halogenated species.

20 Claims, 9 Drawing Sheets

(52) U.S. Cl.
CPC ..... *H01L 21/02532* (2013.01); *H10D 30/751*
(2025.01); *H10D 62/8171* (2025.01); *H01L*
*21/02381* (2013.01)

(56) References Cited

U.S. PATENT DOCUMENTS

| | | | |
|---|---|---|---|
| 9,957,623 | B2 | 5/2018 | Gilliam et al. |
| 10,879,394 | B2 * | 12/2020 | Yeh ................. H01L 21/823807 |
| 2002/0089003 | A1 | 7/2002 | Lee |
| 2003/0230233 | A1 | 12/2003 | Fitzgerald et al. |
| 2008/0017952 | A1 | 1/2008 | Cody et al. |
| 2016/0099178 | A1 * | 4/2016 | Zhang .............. H01L 21/02381 |
| | | | 438/478 |
| 2017/0194430 | A1 * | 7/2017 | Wood ............... H01L 29/78696 |
| 2018/0033615 | A1 * | 2/2018 | Tjandra ............ H01L 21/02507 |
| 2019/0019681 | A1 * | 1/2019 | Wong ............... H01L 21/02532 |
| 2019/0151231 | A1 | 5/2019 | Sommer et al. |
| 2019/0237327 | A1 | 8/2019 | Kohen et al. |
| 2020/0035489 | A1 | 1/2020 | Huang et al. |
| 2020/0144058 | A1 | 5/2020 | Kohen |
| 2020/0152493 | A1 | 5/2020 | Colombeau et al. |
| 2021/0020429 | A1 * | 1/2021 | Khazaka ............ H01L 21/0245 |
| 2021/0091246 | A1 | 3/2021 | Chern |
| 2021/0327704 | A1 * | 10/2021 | Kajbafvala ....... H01L 21/02532 |

FOREIGN PATENT DOCUMENTS

| | | |
|---|---|---|
| JP | H10223537 A | 8/1998 |
| JP | 2001057429 A | 2/2001 |
| JP | 2006523380 A | 10/2006 |
| JP | 2009545169 A | 12/2009 |
| KR | 100849835 B1 | 8/2008 |
| KR | 20200055663 A | 5/2020 |

OTHER PUBLICATIONS

Taiwan Office Action dated Jun. 27, 2023 for Application No. 111127528.

International Search Report and Written Opinion dated Nov. 16, 2022 for Application No. PCT/US2022/037842.

Taiwan Office Action dated Apr. 26, 2024 for Application No. 111127528.

Kohen, David et al., "Abrupt SiGe-to-Si interface: influence of chemical vapor deposition processes and characterization by different metrology techniques", Semiconductor Science and Technology, IOP Publishing, Sep. 5, 2018, pp. 1-7, <https://doi.org/10.1088/1361-6641/aadb83>.

Extended European Search Report dated May 12, 2025 for Application No. 22846606.6.

Korean Office Action dtd Mar. 18, 2025 for Application No. 10-2023-7035638.

Taiwan Office Action dated Jun. 26, 2025 for Application No. 113146566.

Office Action for Singapore Patent Application No. 11202307940X dated Nov. 13, 2025.

Korean Office Action for Application No. 10-2023-7035638 dated Nov. 18, 2025.

* cited by examiner

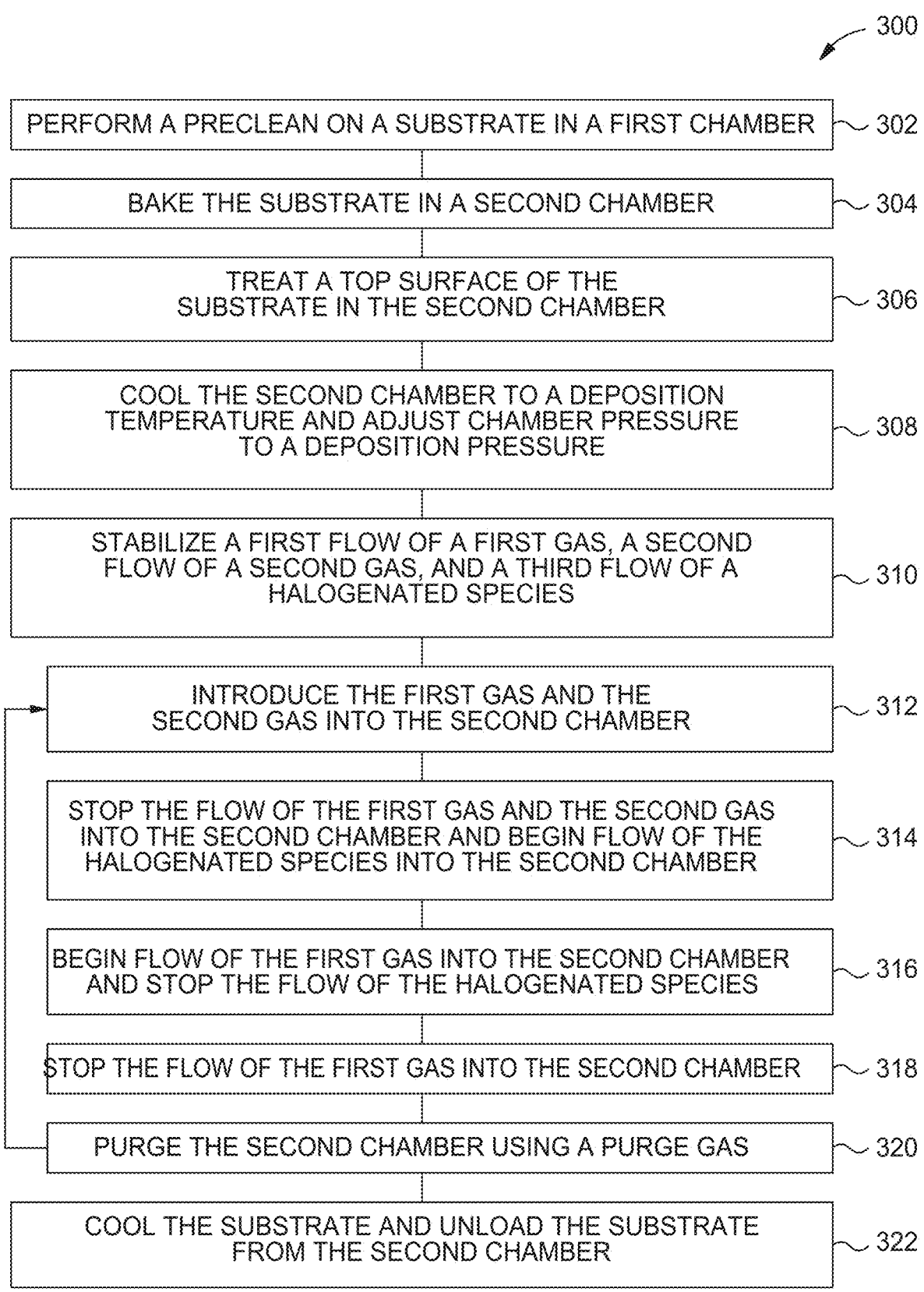

300

PERFORM A PRECLEAN ON A SUBSTRATE IN A FIRST CHAMBER ~ 302

BAKE THE SUBSTRATE IN A SECOND CHAMBER ~ 304

TREAT A TOP SURFACE OF THE
SUBSTRATE IN THE SECOND CHAMBER ~ 306

COOL THE SECOND CHAMBER TO A DEPOSITION
TEMPERATURE AND ADJUST CHAMBER PRESSURE
TO A DEPOSITION PRESSURE ~ 308

STABILIZE A FIRST FLOW OF A FIRST GAS, A SECOND
FLOW OF A SECOND GAS, AND A THIRD FLOW OF A
HALOGENATED SPECIES ~ 310

INTRODUCE THE FIRST GAS AND THE
SECOND GAS INTO THE SECOND CHAMBER ~ 312

STOP THE FLOW OF THE FIRST GAS AND THE SECOND GAS
INTO THE SECOND CHAMBER AND BEGIN FLOW OF THE
HALOGENATED SPECIES INTO THE SECOND CHAMBER ~ 314

BEGIN FLOW OF THE FIRST GAS INTO THE SECOND CHAMBER
AND STOP THE FLOW OF THE HALOGENATED SPECIES ~ 316

STOP THE FLOW OF THE FIRST GAS INTO THE SECOND CHAMBER ~ 318

PURGE THE SECOND CHAMBER USING A PURGE GAS ~ 320

COOL THE SUBSTRATE AND UNLOAD THE SUBSTRATE
FROM THE SECOND CHAMBER ~ 322

FIG. 3A

METHODS OF FORMATION OF A SiGe/Si SUPERLATTICE

CROSS-REFERENCE TO RELATED APPLICATIONS

This application claims priority to U.S. Provisional Patent Application No. 63/225,268, filed Jul. 23, 2021, the entirety of which is herein incorporated by reference.

BACKGROUND

Field

Embodiments of the present disclosure generally relate to a method for forming a semiconductor device. More specifically, the application relates to epitaxial deposition methods for forming silicon and silicon germanium superlattice structures.

Description of the Related Art

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate-all-around (hGAA) structure. The hGAA device structure includes several lattice-matched channels suspended in a stacked configuration and connected by source/drain regions.

Current methods of forming lattice structures for three-dimensional dynamic random access memory (3D DRAM) applications include the formation of alternating silicon and silicon germanium layers. However, previous methods of growing the lattice structures have low growth rates and large transition layers between each layer of the stack. Repeatability of layer formation has also been difficult, such that layer thicknesses and quality are variable throughout the structure.

Therefore, there is a need for a method of forming silicon and silicon germanium lattice structures quickly, with small transition layers, and with improved quality.

SUMMARY

Aspects described herein relate to a methods for forming a semiconductor device. In one embodiment a method of forming a semiconductor device is described. The method includes (a) introducing a silicon containing gas and a germanium containing gas into a deposition chamber to form a silicon-germanium layer on a substrate within the deposition chamber, (b) stopping the flow of the silicon containing gas and the germanium containing gas into the deposition chamber after forming the silicon-germanium layer, (c) flowing a halogenated species into the deposition chamber, and (d) introducing a silicon containing gas into the deposition chamber to form a silicon layer on a substrate within the deposition chamber.

In another embodiment a method for forming a semiconductor device includes forming a unit cell by introducing a silicon containing gas and a germanium containing gas into a deposition chamber to form a silicon-germanium layer on a substrate within the deposition chamber, stopping the flow of the silicon containing gas and the germanium containing gas into the deposition chamber after forming the silicon-germanium layer, flowing a halogenated species into the deposition chamber, and introducing a silicon containing gas into the deposition chamber to form a silicon layer on a substrate within the deposition chamber from the silicon containing gas, and repeating the forming the unit cell to form a stack of unit cells.

In another aspect the semiconductor includes a super-lattice device structure, including a first unit cell which includes a first silicon-germanium layer and a first silicon layer disposed on the first silicon-germanium layer. The super-lattice device structure further includes a second unit cell which includes a second silicon-germanium layer and a second silicon layer disposed on the second silicon-germanium layer. The transition widths between each of the silicon-germanium layers and the germanium layers is less than about 1.4 nm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 3A and 3B illustrate a method of forming the super-lattice structure of FIGS. 2A and 2B, according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure is directed towards methods of forming a super-lattice structure, such as a silicon germanium (SiGe)/silicon (Si) super-lattice structure used during the formation of 3D DRAM devices. It is beneficial to have uniform layers (in thickness and composition) across the diameter of a wafer, uniform layer-to-layer thickness and composition between the unit cells of a layer stack, and abrupt chemical transitions between each layer within the super-lattice structure. Described herein is a method of forming a super-lattice structure which has improved uniformity within each layer, improved layer-to-layer uniformity, and more abrupt chemical transitions between each of the layers.

The methods and chemistries described herein further enable high growth rates of SiGe and Si layers within a super-lattice device with abrupt interfaces during a deposition process. Isothermal and isobaric process conditions are utilized during the deposition process. The deposition process includes the use of halogenated species or halogenated precursors. The use of the halogenated precursors has been shown to increase the abruptness of the chemical transition between the layers and improves the growth rate of the layers. The halogenated species can be either co-flowed with a silicon and/or germanium containing reactive gas or flowed sequentially between the formation of each of the layers. Ballasting of the total flow across the deposition layers to minimize flow disruption from layer-to-layer further improves the overall device layer formation results.

Methods described herein have been shown to have growth rates exceeding about 150 nm/min for both SiGe and Si layer formation. The high growth rates are achieved with abrupt layer transitions of less than about 1.4 nm. Layer-to-layer repeatability has also been shown to be improved when using specific pyrometer temperature control schemes. The pyrometer temperature control scheme includes the use of pyrometers disposed above the substrate to reduce thermal drift as the layers are formed on the substrate.

Figure 1:
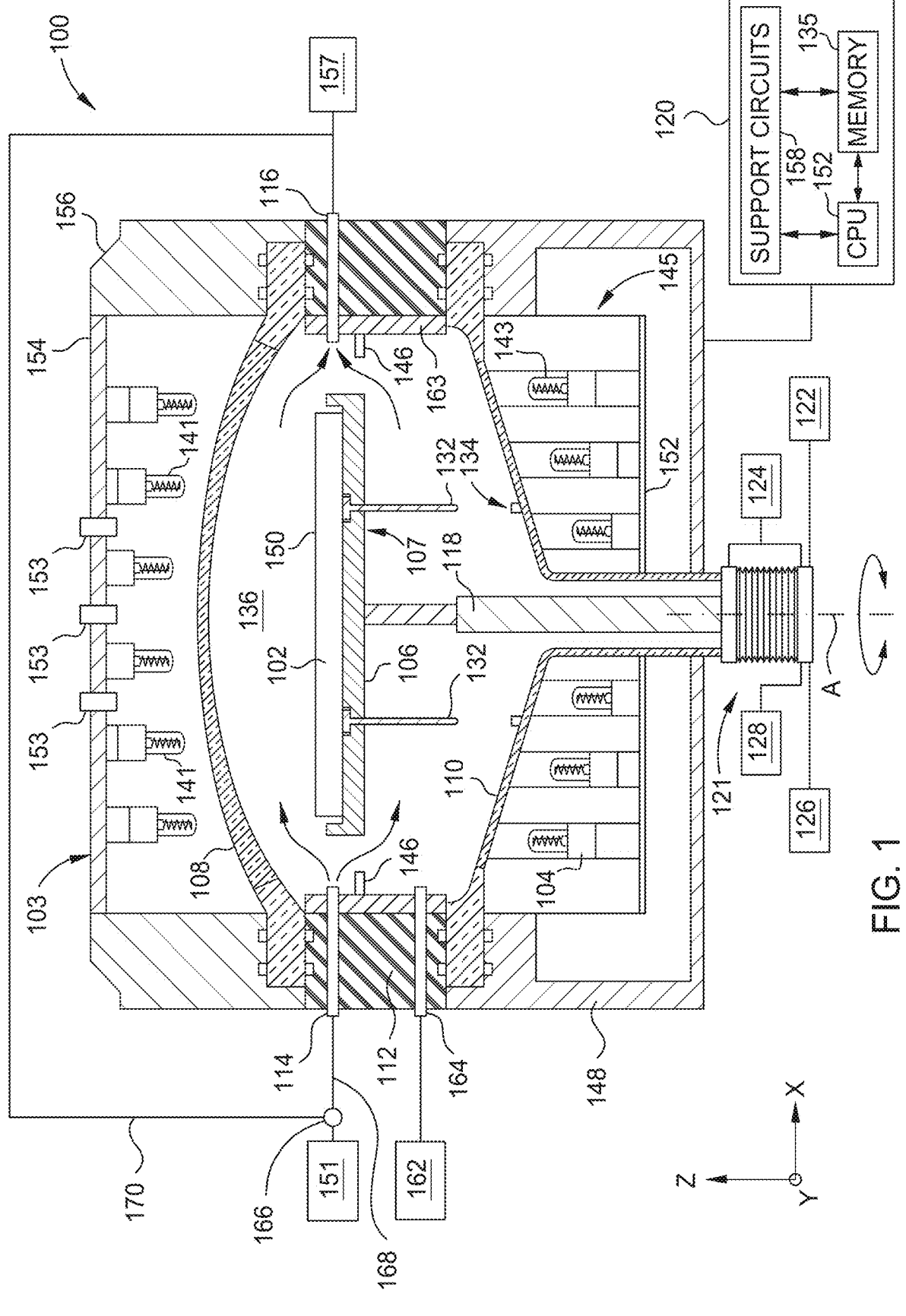
FIG. 1 is a schematic illustration of a type of deposition chamber, according to one embodiment of the disclosure.

FIG. 1 is a schematic illustration of a type of deposition chamber 100 according to one embodiment of the present disclosure. The deposition chamber 100 is utilized to grow an epitaxial film on a substrate, such as a substrate 102. The deposition chamber 100 creates a cross-flow of precursors across a top surface 150 of the substrate 102.

The deposition chamber 100 includes an upper body 156, a lower body 148 disposed below the upper body 156, a flow module 112 disposed between the upper body 156 and the lower body 148. The upper body 156, the flow module 112, and the lower body 148 form a chamber body. Disposed within the chamber body is a substrate support 106, an upper dome 108, a lower dome 110, a plurality of upper lamps 141, and a plurality of lower lamps 143. As shown, a controller 120 is in communication with the deposition chamber 100 and is used to control processes, such as those described herein. The substrate support 106 is disposed between the upper dome 108 and the lower dome 110. The plurality of upper lamps 141 are disposed between the upper dome 108 and a lid 154. The lid 154 includes a plurality of sensors 153 disposed therein for measuring the temperature within the deposition chamber 100. At least one of the plurality of sensors 153 may be a pyrometer for measuring the temperature of the substrate 102. The plurality of lower lamps 143 are disposed between the lower dome 110 and a floor 152. The plurality of lower lamps 143 form a lower lamp assembly 145.

A processing volume 136 is formed between the upper dome 108 and the lower dome 110. The processing volume 136 has the substrate support 106 disposed therein. The substrate support 106 includes a top surface on which the substrate 102 is disposed. The substrate support 106 is attached to a shaft 118. The shaft is connected to a motion assembly 121. The motion assembly 121 includes one or more actuators and/or adjustment devices that provide movement and/or adjustment of the shaft 118 and/or the substrate support 106 within the processing volume 136. The motion assembly 121 includes a rotary actuator 122 that rotates the shaft 118 and/or the substrate support 106 about a longitudinal axis A of the deposition chamber 100. The motion assembly 121 further includes a vertical actuator 124 to lift and lower the substrate support 106 in the z-direction. The motion assembly includes a tilt adjustment device 126 that is used to adjust the planar orientation of the substrate support 106 and a lateral adjustment device 128 that is used to adjust the position of the shaft 118 and the substrate support 106 side to side within the processing volume 136.

The substrate support 106 may include lift pin holes 107 disposed therein. The lift pin holes 107 are sized to accommodate a lift pin 132 for lifting of the substrate 102 from the substrate support 106 either before or after a deposition process is performed. The lift pins 132 may rest on lift pin stops 134 when the substrate support 106 is lowered from a processing position to a transfer position.

The flow module 112 includes a plurality of process gas inlets 114, a plurality of purge gas inlets 164, and one or more exhaust gas outlets 116. The plurality of process gas inlets 114 and the plurality of purge gas inlets 164 are disposed on the opposite side of the flow module 112 from the one or more exhaust gas outlets 116. One or more flow guides 146 are disposed below the plurality of process gas inlets 114 and the one or more exhaust gas outlets 116. The flow guide 146 is disposed above the purge gas inlets 164. A liner 163 is disposed on the inner surface of the flow module 112 and protects the flow module 112 from reactive gases used during deposition processes. The process gas inlets 114 and the purge gas inlets 164 are positioned to flow a gas parallel to the top surface 150 of a substrate 102 disposed within the processing volume 136. The process gas inlets 114 are fluidly connected to a process gas source 151. The purge gas inlets 164 are fluidly connected to a purge gas source 162. The one or more exhaust gas outlets 116 are fluidly connected to an exhaust pump 157. Each of the process gas source 151 and the purge gas source 162 may be configured to supply one or more precursors or process gases into the processing volume 136.

In embodiments described herein, a valve 166 is disposed fluidly between the process gas source 151 and the process gas inlets 114. The valve 166 is configured to divert or split gases flowed from the process gas source 151 into one of a first gas conduit 168 or a second gas conduit 170. The first gas conduit 168 fluidly connects the valve 166 and the process gas inlets 114. The second gas conduit 170 fluidly connects the valve 166 and the exhaust pump 157, such that gas is diverted around the process volume 136 and exhausted without entering the process volume 136. As described herein, the valve 166 may be a flow diverter or flow divider. The valve 166 may be used to split the gas flow such that a controlled amount enters the process volume 136 while the remaining process gas is flowed around the process volume 136. In some embodiments, there are multiple valves 166 and multiple additional conduits similar to the first gas conduit 168 and the second gas conduit 170. The additional valves and conduits are used to enable different gas combinations to be utilized within the process volume 136, such that a single gas combination is flowed into and out of each valve 166, but multiple gas combinations may enter the processing volume 136 via the process gas inlets 114.

The substrate 102 may be a material such as crystalline silicon (e.g., Si<100> and/or Si<110>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 102 may have various dimensions, such as 200 mm, 300 mm, 450 mm, or other diameter, as well as, being a rectangular or square panel. Unless otherwise noted, examples described herein are conducted on substrates with a 200 mm diameter, a 300 mm diameter, or a 450 mm diameter substrate.

Figures 2A, 2B:
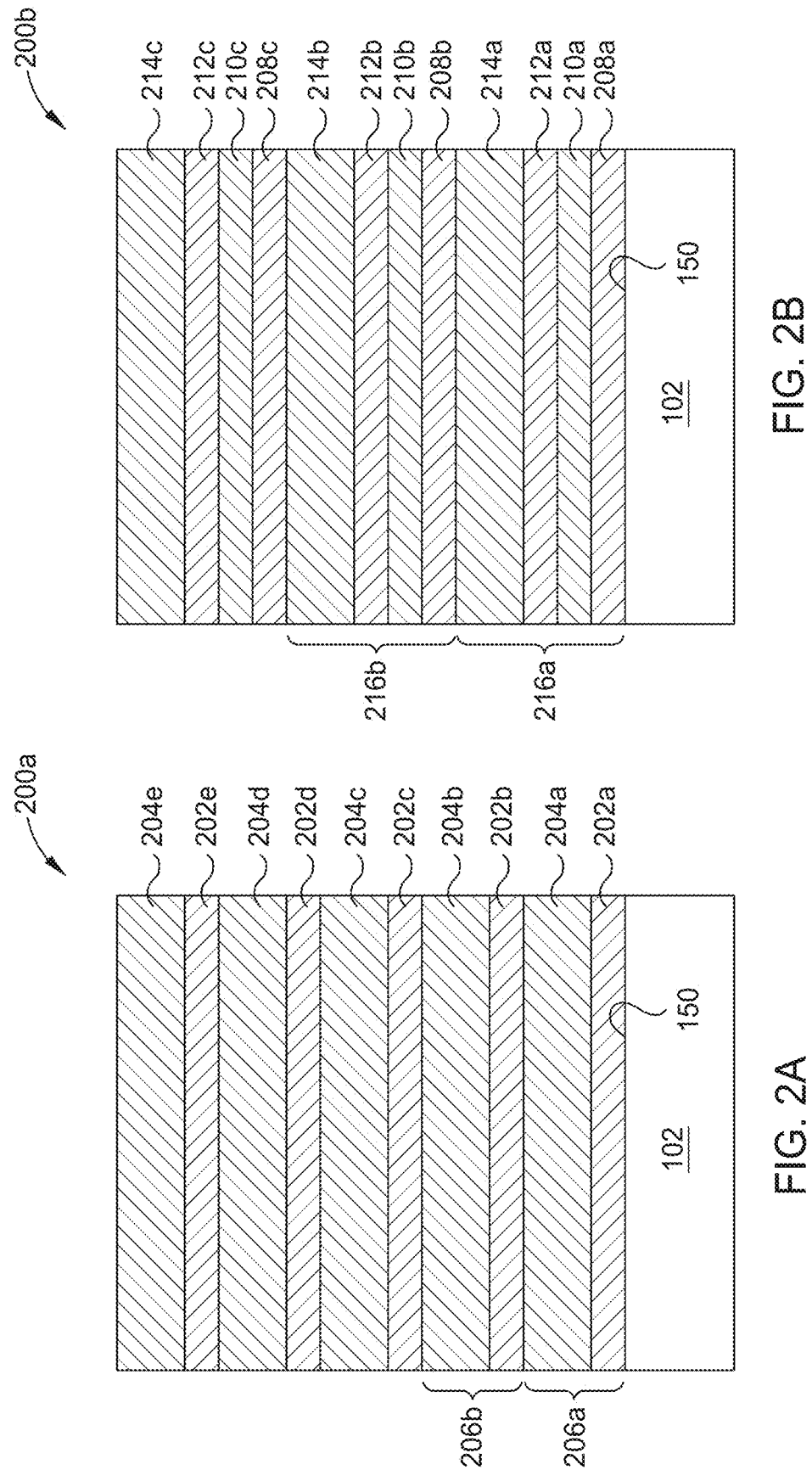
FIGS. 2A and 2B are schematic cross-sectional views of a super-lattice structure, according to one embodiment of the disclosure.

FIGS. 2A and 2B are schematic cross-sectional views of super-lattice structures 200a, 200b disposed on the top surface 150 of the substrate 102 of FIG. 1. The super-lattice structures 200a, 200b include a plurality of layers and a plurality of unit cells as described herein. The super-lattice structures 200a, 200b are formed to enable the future formation of devices such as 3D DRAM devices.

FIG. 2A is a first super-lattice structure 200a. The first super-lattice structure 200a is formed using unit cells 206a, 206b of two layers. Each unit cell 206a, 206b includes one first layer 202a-202e and one second layer 204a-204e. The first layers 202a-202e are a silicon-germanium layer, such that the first layers 202a-202e include both silicon and germanium. The first layers 202a-202e include about 50% to about 90% silicon and about 10% to about 30% germanium, such as about 70% to about 90% silicon and about 12% to about 30% germanium. The second layers 204a-204e are a silicon containing layer, such that the second layers 204a-204e include silicon, but substantially no germanium, such as less than 1% germanium, such as less than 0.5% germanium, such as less an 0.1% germanium. The second layers 204a-204b are greater than 95% silicon, such as greater than 98% silicon, such as greater than 99% silicon, such as greater than 99.5% silicon.

The first layers 202a-202e and the second layers 204a-204e are disposed in an alternating fashion, such that between each pair of first layers 202a-202e is a second layer 204a-204e. The first unit cell 206a includes a first layer 202a disposed on the top surface 150 of the substrate 102. A second layer 204a is disposed directly on top of the first layer 202a and forms the first unit cell 206a. The second unit cell 206b includes a first layer 202b disposed on top of a second layer 204a. An additional second layer 204b is disposed on top of the first layer 202b and forms the second unit cell 206b. Additional unit cells are formed using subsequent alternating first layers 202c, 202d, 202e and second layers 204c, 202d, 204e.

In embodiments described herein, the thickness of the second layers 204a-204e is greater than the thickness of the first layers 202a-202e. In alternative embodiments, the thickness of the first layers 202a-202e is greater than the thickness of the second layers 204a-204e.

In embodiments described herein, there are greater than 30 unit cells 206a, 206b, such as greater than 50 unit cells, such as greater than 75 unit cells 206a, 206b, such as greater than 100 unit cells 206a, 206b.

FIG. 2B is a second super-lattice structure 200b. The second super-lattice structure 200b is formed using unit cells 216a, 216b of four layers. Each unit cell 216a, 216b includes one first layer 208a, 208b, 208c, one second layer 210a, 210b, 210c, one third layer 212a, 212b, 212c, and one fourth layer 214a, 214b, 214c. Each of the first layers 208a, 208b, 208c and the third layers 212a, 212b, 212c are a silicon-germanium layer, such that the first layers 208a, 208b, 208c and the third layers 212a, 212b, 212c include both silicon and germanium. The first layers 208a, 208b, 208c and the third layers 212a, 212b, 212c include about 50% to about 90% silicon and about 10% to about 30% germanium, such as about 70% to about 90% silicon and about 12% to about 30% germanium. The second layers 210a, 210b, 210c and the fourth layers 214a, 214b, 214c are a silicon containing layer, such that the second layers 210a, 210b, 210c and the fourth layers 214a, 214b, 214c include silicon, but substantially no germanium, such as less than 1% germanium, such as less than 0.5% germanium, such as less an 0.1% germanium. The second layers 210a, 210b, 210c and the fourth layers 214a, 214b, 214c are greater than 95% silicon, such as greater than 98% silicon, such as greater than 99% silicon, such as greater than 99.5% silicon.

The first layer 208a, 208b, 208c, the second layer 210a, 210b, 210c, the third layer 212a, 212b, 212c, and the fourth layer 214a, 214b, 214c are stacked, such that a second layer 210a, 210b, 210c is disposed on top of the first layer 208a, 208a, 208c, a third layer 212a, 212b, 212c is disposed on top of the second layer 210a, 210b, 210c, and a fourth layer 214a, 214b, 214c is disposed on top of the third layer 212a, 212b, 212c. As shown in FIG. 2B, a first layer 208a is disposed on the top surface 150 of the substrate 102. A second layer 210a is disposed on the first layer 208a. A third layer 212a is disposed on the second layer 210a. A fourth layer 214a is disposed on the third layer 212a. The first layer 208a, the second layer 210a, the third layer 212a, and the fourth layer 214a form a first unit cell 216a. A second set of a first layer 208b, a second layer 210b, a third layer 212b, and a fourth layer 214b are disposed on top of the first unit cell 216a and form a second unit cell 216b. Additional sets of layers are disposed on the substrate 102 to form additional unit cells.

In embodiments described herein, there are greater than 30 unit cells 216a, 216b, such as greater than 50 unit cells, such as greater than 75 unit cells 216a, 216b, such as greater than 100 unit cells 216a, 216b. As shown in FIG. 2B, the thicknesses of each of the first layer 208a, 208b, 208c, the second layer 210a, 210b, 210c, the third layer 212a, 212b, 212c, and the fourth layer 214a, 214b, 214c are varied. As shown herein, the first layers 208a, 208b, 208c and the third layers 212a, 212b, 212c have a similar thickness, while the second layers 210a, 210b, 210c have a smaller thickness than the fourth layers 214a, 214b, 214c. The thicknesses and number of layers within each unit cell 216a, 216b as described herein are exemplary. Other layer thickness combinations and layer combinations are also contemplated.

Figure 3B:
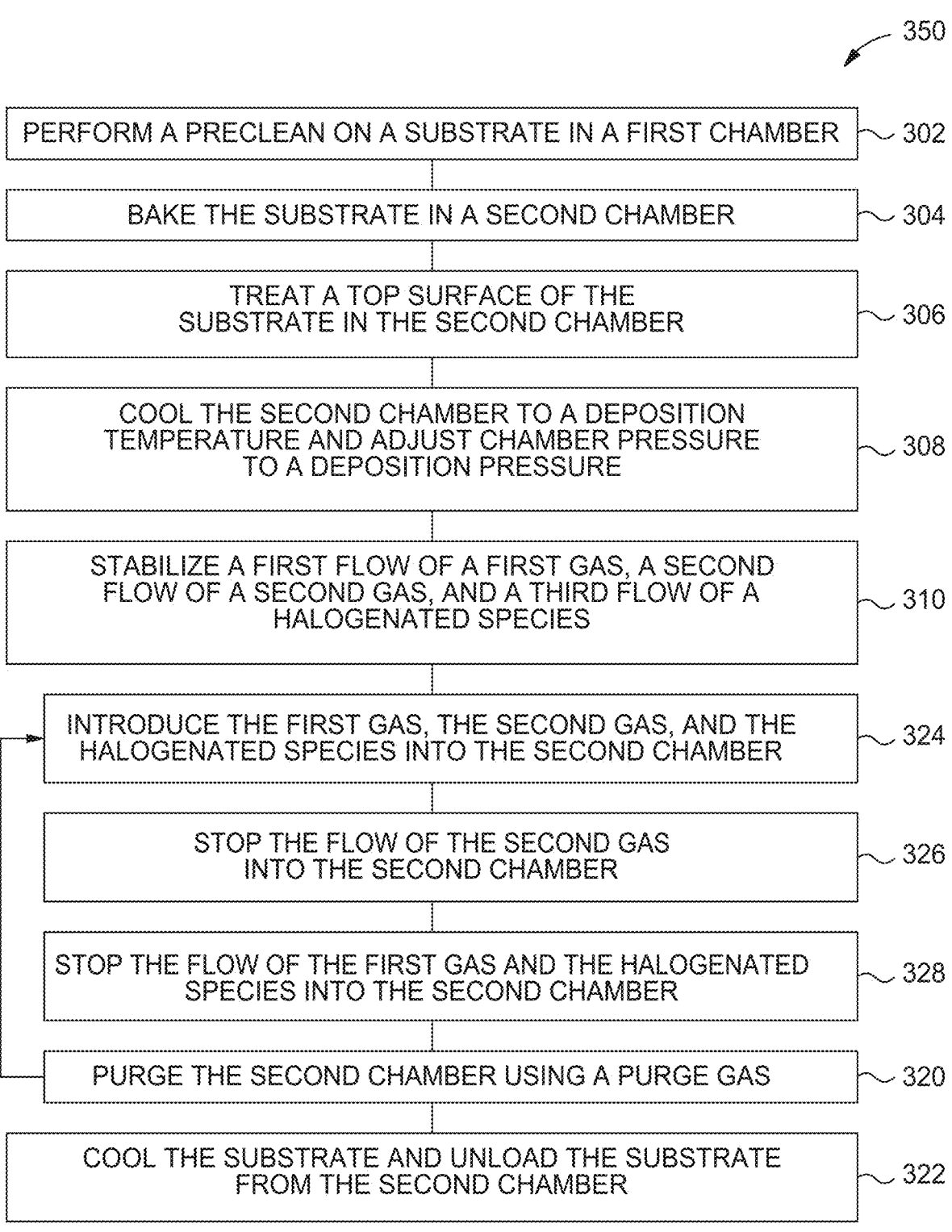

FIGS. 3A and 3B illustrate methods 300, 350 of forming super-lattice structures similar to the super-lattice structures 200a, 200b of FIGS. 2A and 2B. FIG. 3A illustrates a first method 300. The first method 300 includes an operation 302 of performing a pre-clean process on a substrate, such as the substrate 102, in a first chamber. The pre-clean may remove any native oxides formed on the top surface 150 of the substrate 102. The substrate 102 is then moved from the first chamber to a second chamber. After the pre-clean operation 302, the substrate 102 is baked within the second chamber during an operation 304. The second chamber may be similar to the deposition chamber 100 of FIG. 1 and may be an epitaxial deposition chamber. In some embodiments, the operation 302 is optional when the bake during the operation 304 is performed at a high temperature, such as greater than about 500° C., such as greater than about 750° C., such as greater than about 850° C. After baking the substrate 102, the top surface 150 of the substrate may be treated in the second chamber during an operation 306. The treatment may include a high-temperature growth of silicon on the substrate 102. The high-temperature growth of silicon is performed at a temperature of greater than about 500° C., such as greater than about 750° C., such as greater than about 850° C. During the high-temperature growth of silicon, a silicon precursor is introduced into the second chamber.

After treating the substrate 102, the second chamber is cooled to a deposition temperature during an operation 308.

The second chamber is either simultaneously or sequentially brought to a deposition pressure during the operation 308. The deposition temperature as described herein is less than about 850° C., such as about 500° C. to about 850° C., such as about 550° C. to about 850° C., such as about 550° C. to about 800° C. The deposition pressure is about 1 torr to about 50 torr, such as about 3 torr to about 30 torr, such as about 5 torr to about 25 torr. In some embodiments, either one or both of the temperature or the pressure is already at the deposition temperature or the deposition pressure before the operation 308. The temperature and the pressure are stabilized during the operation 308, such that the temperature and the pressure stay within a pre-determined range, such as a range of less than about 75° C., such as less than about 50° C., such as less than about 25° C., such as less than about 10° C. The pressure is stabilized to stay within a range of less than about 10 torr, such as less than about 5 torr, such as less than about 3 torr, such as less than about 1 torr.

After or simultaneously to the adjustment of the temperature and the pressure within the second chamber, a first flow of a first gas, a second flow of a second gas, and a third flow of a halogenated species is stabilized during an operation 310 within a conduit leading from a process gas source, such as the process gas source 151. Stabilizing the flow of the gases includes flowing each of the first gas, the second gas, and the halogenated species at a flow rate equal to the maximum flow rate utilized within the method 300. Alternatively, the flow rate may be less than the maximum flow rate utilized within the method 300. Stabilizing the flow of each of the first gas, the second gas, and the halogenated species before beginning the deposition operations enables the flow rate of each of the gases to be quickly adjusted between each layer formation to reduce the transition width between each of the layers. The stabilized gas flow may be diverted around a processing volume of the second chamber, such that the stabilized gas flow is diverted at a valve or flow diverter to the exhaust.

As described herein, the first gas is a silicon containing gas, the second gas is a germanium containing gas, and the halogenated species is a gas containing a halogen precursor or a halogen gas. The silicon containing gas includes any one or a mixture of silane ($SiH_4$), disilane ($Si_2H_6$), dichlorosilane ($SiH_2Cl_2$), or trichlorosilane ($SiCl_3H$). The germanium containing gas includes any one or a mixture of germane ($GeH_4$) or digermane ($Ge_2H_6$). The halogenated species includes any one or a mixture of $H_xSiY_{(4-x)}$, $H_xGeY_{(4-x)}$, or HY, where x is equal to an integer between 0-3 and y is equal to one of chlorine (Cl), bromine (Br), or iodine (I). Therefore, the halogenated species may include any one of $H_3SiCl$, $H_2SiCl_2$, $HSiCl_3$, $H_3GeCl$, $H_2GeCl_2$, $HGeCl_3$, or HCl. Variants utilizing bromine or iodine are also theorized.

Figure 4A:
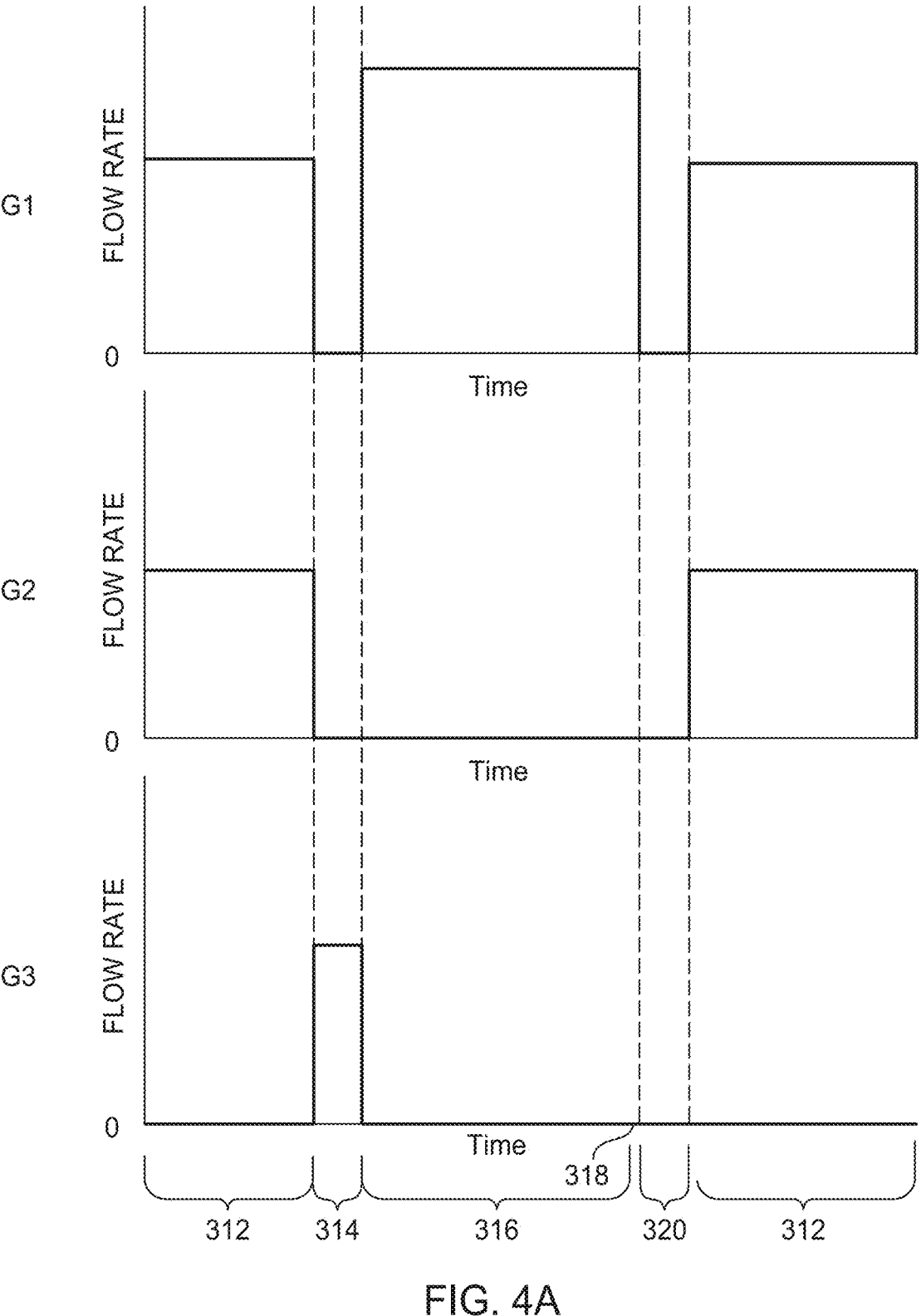
FIGS. 4A and 4B illustrate process gas flow graphs during a portion of the methods of FIGS. 3A and 3B, according to one embodiment.

After stabilizing the gas flow, the first gas and the second gas are introduced into the process volume of the second chamber via a plurality of inlets, such as the process gas inlets 114, during an operation 312. The introduction of the first gas and the second gas into the process volume enables the formation of a silicon-germanium layer, such as the silicon germanium layers 202a-202e, 208a-208c, and 212a-212c. The first gas and the second gas are flowed at a first flow rate as illustrated in FIG. 4A. Using process conditions and precursors similar to those described herein, the growth rates of the silicon germanium layers 202a-202e, 208a-208c, and 212a-212c is greater than about 100 nm/min, such as greater than about 150 nm/min, such as greater than about 200 nm/min.

After the operation 312, the flow of the first gas and the second gas into the second chamber is stopped and the halogenated species is flowed into the second chamber during an operation 314. Stopping the flow of the first gas and the second gas into the second chamber only stops the flow into the process volume. The first gas and the second gas are therefore, redirected to a vent or exhaust similarly as during the gas flow stabilization of operation 310. The flowing of the halogenated species into the second chamber is performed either subsequent to or simultaneously with the stopping of the first gas and the second gas flow into the second chamber. During the operation 314, layer formation is halted or slowed. The flow of the halogenated species between the deposition of the two layers reduces width of the interfacial boundaries between each of the layers. It has been found the halogens within the halogenated species suppress germanium diffusion and accumulation near the surface of the silicon-germanium layers and therefore reduces the diffusion of germanium into the silicon layers deposited on top of the silicon-germanium layers.

After the operation 314, the first gas is again flowed into the second chamber and the flow of the halogenated species is stopped during an operation 316. Stopping the flow of the halogenated species includes stopping flow of the halogenated species into the process volume with the substrate, but the halogenated species is still flowed at a stabilized rate to a vent or exhaust in a similar manner as during the gas flow stabilization of operation 310. The flow of the first gas into the second chamber is used to grow the silicon layers, such as the second layers 204a-204e, the second layers 210a-210c and the fourth layers 214a-214c. The flow rate of the first gas into the second chamber may be either greater than or equal to the flow rate of the first gas into the second chamber during the operation 312. As shown in FIG. 4A, the flow rate of the first gas is greater during the operation 316 than during the operation 312. The second gas is not flowed during the operation 316 to enable the formation of a layer without germanium.

After the formation of a silicon layer during the operation 316, the flow of the first gas into the second chamber is stopped during an operation 318. Stopping the flow of the first gas includes stopping the first gas flow into the process volume with the substrate, but the first gas is still flowed at the stabilized flow rate. Instead of being flowed into the process volume, the first gas is redirected to a vent or exhaust in a similar manner as that described in operation 310.

After stopping the flow of the first gas, a purge gas is introduced into the second chamber during an operation 320. Introducing the purge gas into the second chamber stops the formation of the layers on the super-lattice structures 200a, 200b. The purge gas may be an inert gas, such that the purge gas includes one or a combination of Nitrogen ($N_2$), Helium (He), Neon (Ne), Argon (Ar), or Krypton (Kr). The purge gas may also be flowed during each of the other process operations, such as during process operations 310, 312, 314, 316, and 318.

After purging the processing volume of the second chamber, operation 312 through operation 320 may be repeated a desired number of times, such as greater than 25 times, such as greater than 50 times, such as greater than 75 times, such as greater than 100 times. The repetition of each of operation 312, operation 314, operation 316, operation 316, operation 318, and operation 320 form a stack of unit cells 206a, 206b to a desired number of unit cells 206a, 206b.

After forming the layers of the super-lattice structures 200a, 200b, the substrate is cooled and unloaded from the second chamber during an operation 322. Cooling of the substrate may be performed by halting the application of heat to the substrate. The substrate is cooled to a temperature of less than about 850° C., such as less than about 700° C., such as less than about 600° C., such as less than about 500° C.

The method 350 of FIG. 3B is similar to the method 300 of FIG. 3A, but operations 324-328 replace operations 312-318. During the operation 324, the first gas, the second gas, and the halogenated species are introduced into the second chamber simultaneously to form a silicon germanium layer. Introducing the halogenated species during formation of the silicon germanium layers, such as the silicon germanium layers 202a-202e, 208a-208c, and 212a-212c, has been shown to reduce the transition width between each subsequent layer by suppressing germanium diffusion or collection within the super-lattice structures 200a, 200b. The halogenated species does not slow the film growth as would occur if an etchant was introduced. It is theorized the halogen molecules being disposed within the silicon-containing or germanium-containing molecules described herein reduces or eliminates the etch back effect of the halogen.

After the operation 324, the flow of the second gas into the second chamber is stopped during an operation 326. Stopping the flow of the second gas into the second chamber enables the growth of the silicon layers, such as the second layers 204a-204e, the second layers 210a-210c and the fourth layers 214a-214c. Stopping the flow of the second gas includes stopping the second gas flow into the process volume with the substrate, but the second gas is still flowed at the stabilized flow rate. Instead of being flowed into the process volume, the second gas is redirected to a vent or exhaust in a similar manner as that described in operation 310. During the transition of the flow from both the first gas and the second gas flowing into the second chamber to only the first gas flowing into the chamber, the flow rate of the halogenated species may be increased to assist in purging the processing volume and suppressing the diffusion or accumulation of germanium near the boundary of the first layers and the second layers. After the flow of the second gas is stopped during the operation 326 or simultaneously to the stopping of the flow of the second gas during the operation 316, the flow rate of the first gas is increased to increase the deposition rate of the silicon layer.

After the formation of the silicon layer, the flow of the first gas and the halogenated species into the second chamber is stopped during an operation 328. Stopping the flow of the first gas and the halogenated species includes stopping the first gas flow and the halogenated species flow into the process volume with the substrate, but the first gas and the halogenated species are still flowed at the stabilized flow rate. Instead of being flowed into the process volume, the first gas and halogenated species are redirected to a vent or exhaust in a similar manner as that described in operation 310. After stopping the flow of the first gas and the halogenated species, a purge gas is introduced into the second chamber during the operation 320. Introducing the purge gas into the second chamber stops the formation of the layers on the super-lattice structures 200a, 200b. After purging the processing volume of the second chamber, operation 324 through operation 320 may be repeated a desired number of times, such as greater than 25 times, such as greater than 50 times, such as greater than 75 times, such as greater than 100 times.

During each of operation 310, operation 312, operation 314, operation 316, operation 318, and operation 320, of the method 300 the temperature and pressure within the process volume is held relatively constant at the stabilized temperature and pressure established during the operation 308. Although slight variation of the temperature and the pressure may be measured, the temperature varies by less than about 100° C. between any two of operation 310, operation 312, operation 314, operation 316, operation 318, and operation 320. In some embodiments, the temperature varies by less than about 50° C. between any two of operation 310, operation 312, operation 314, operation 316, operation 318, and operation 320. In some embodiments, the temperature varies by less than about 25° C. between any two of operation 310, operation 312, operation 314, operation 316, operation 318, and operation 320. Similarly, the temperature and pressure are held relatively constant during operation 310, operation 324, operation 326, operation 328, and operation 320 during the method 350. Therefore, the temperature varies by less than about 100° C. between any two of operation 310, operation 324, operation 326, operation 328, and operation 320. In some embodiments, the temperature varies by less than about 50° C. between any two of operation 310, operation 324, operation 326, operation 328, and operation 320. In some embodiments, the temperature varies by less than about 25° C. between any two of operation 310, operation 324, operation 326, operation 328, and operation 320.

Figure 4B:
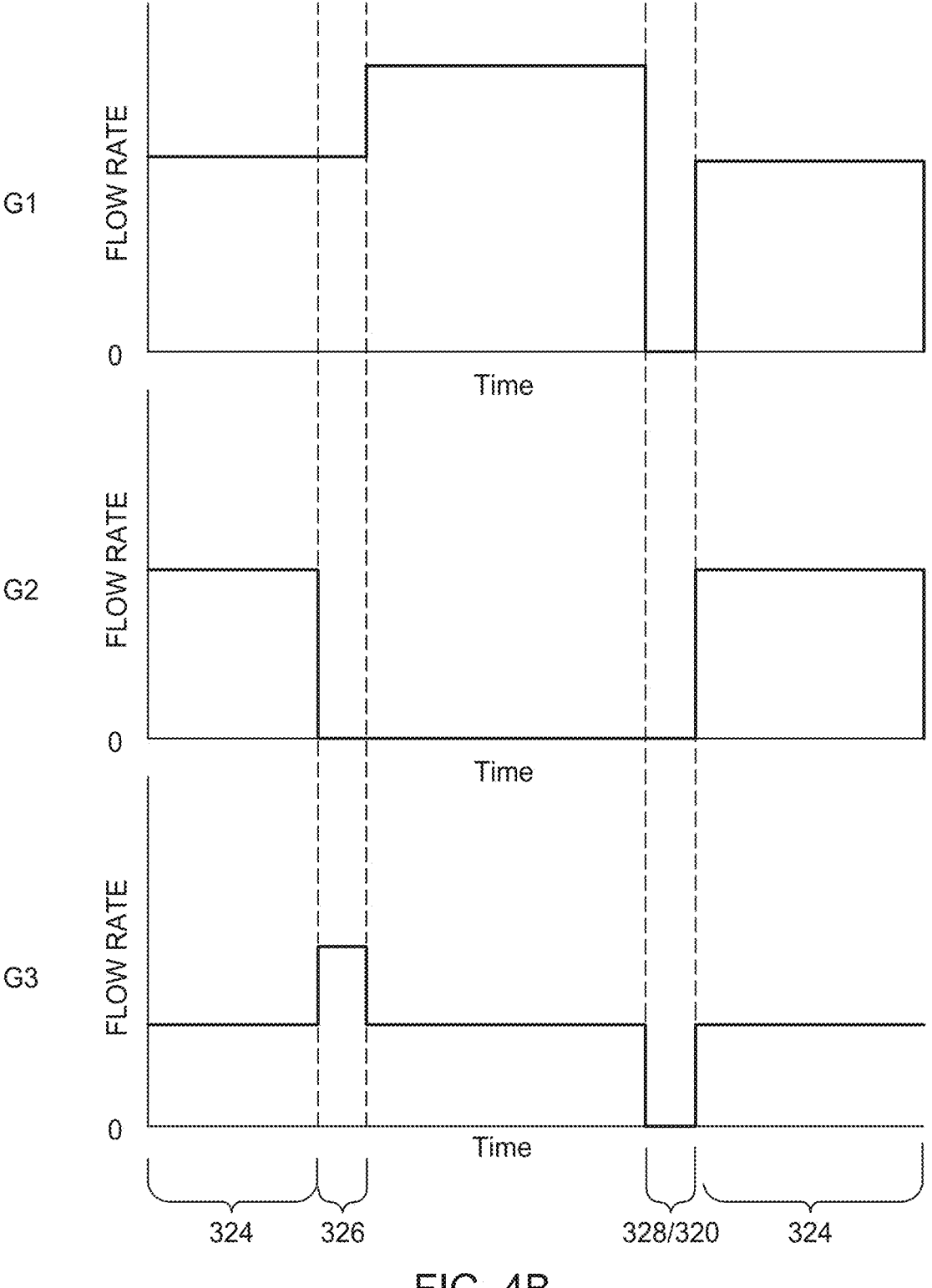

FIGS. 4A and 4B illustrate process gas flow graphs during a portion of the methods of FIGS. 3A and 3B. As shown in FIGS. 4A and 4B, a set of first graphs G1 illustrate the flow rate of the first gas, a set of second graphs G2 illustrate the flow rate of the second gas, and a set of third graphs G3 illustrate the flow rate of the halogenated species into the process volume of the second chamber. The exact flow rates described herein are exemplary. Additional gas flow combinations are contemplated.

In one embodiment, the flow rate of the halogenated species is constant throughout each of the operations 312-316 of the first method 300 and through each of the operations 324-328 of the second method 350. The flow rate of the first gas may also be similar through operations 312 and 316 of the first method 300 as well as through operations 324-328 of the second method 350. As shown in FIGS. 4A and 4B, the film formation operations repeat after purging the process volume of the second chamber during the purge operation 320.

Figure 5B:
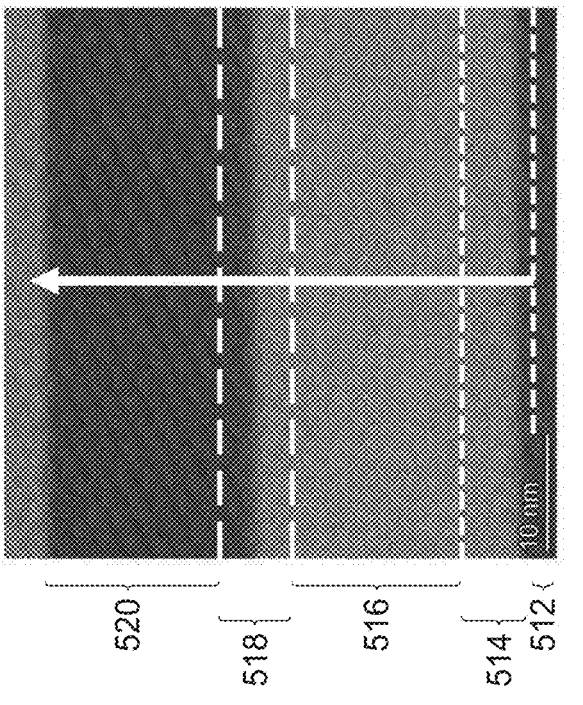
FIGS. 5A and 5B illustrate electron microscope measurements of layers of a super-lattice structure.
Figure 5A:
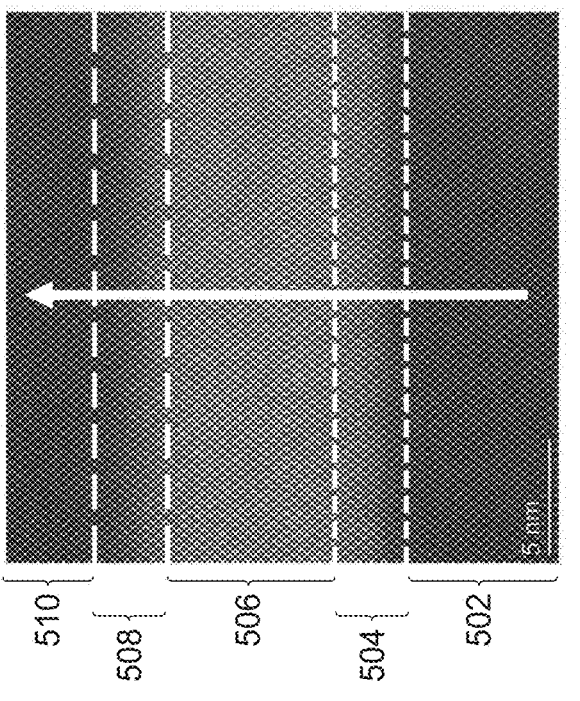

FIGS. 5A and 5B illustrate electron microscope measurements of layers of a super-lattice structure. The cross-section illustrated by FIG. 5A is formed using a silicon-germanium layer of about 85% silicon and about 15% germanium. The cross-section illustrated by FIG. 5B is formed using a silicon-germanium layer of about 75% silicon and about 25% germanium. During the formation of the super-lattice structures of FIGS. 5A and 5B, a halogenated species is introduced between the formation of each of the layers to assist in reducing the transition width between the layers.

Figure 6A:
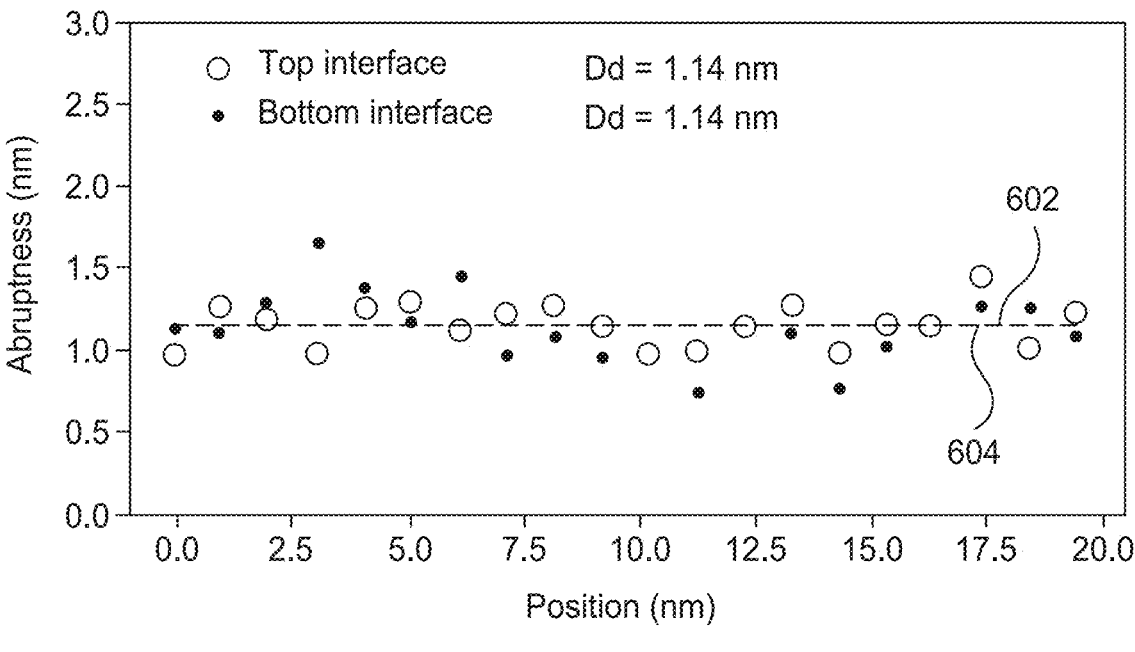
FIGS. 6A and 6B illustrate graphs of the transition width measurements of the super-lattice structures of FIGS. 5A and 5B.

FIG. 5A illustrates a single silicon-germanium layer 506 disposed between two silicon layers 502, 510. The first silicon layer 502 and the silicon-germanium layer 506 include a first transition zone 504 disposed therebetween. The silicon-germanium layer 506 and the second silicon layer 502 include a second transition zone 508 disposed therebetween. The width of the transition zones 504, 508 over different lateral positions are graphed in FIG. 6A. As shown in FIG. 6A, the transition widths of the first transition zone 504 and the second transition zone 508 are both about 1.14 nm on average across the measured lateral portion of the lattice structure. In FIG. 6A, an average first transition width line 602 represents the average transition width across the first transition zone 504. An average second transition width line 604 represents the average transition width across the second transition zone 508.

Figure 6B:
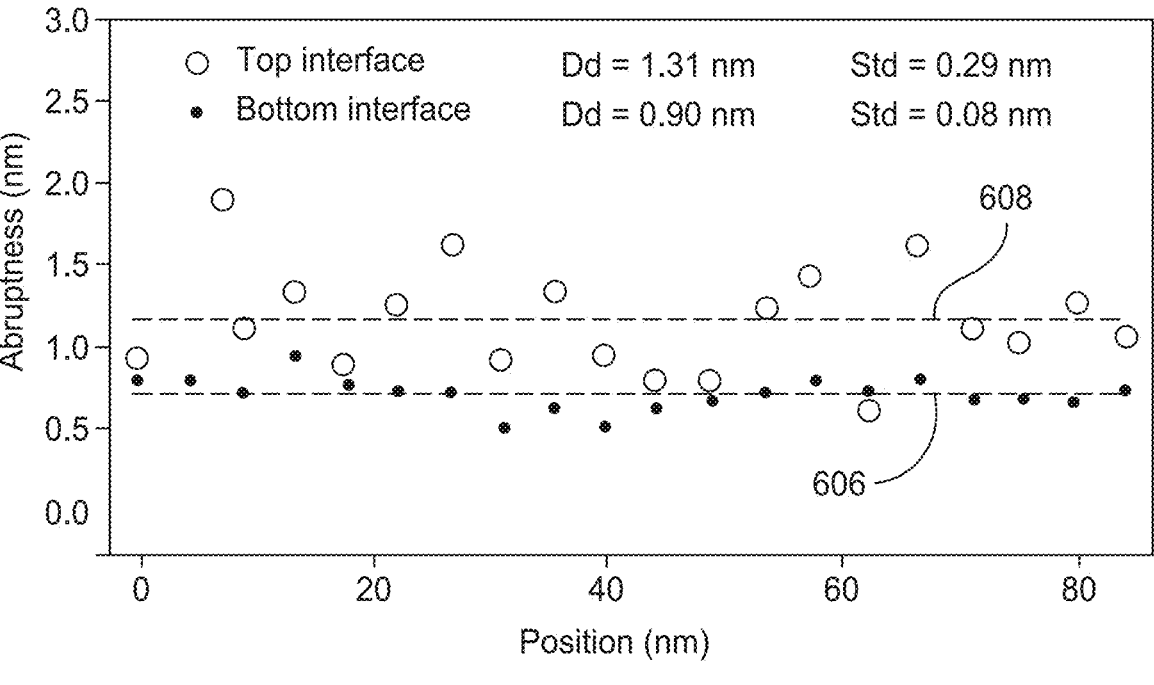

FIG. 5B illustrates a single silicon-germanium layer 516 disposed between two silicon layers 512, 520. The first silicon layer 512 and the silicon-germanium layer 516 include a first transition zone 514 disposed therebetween. The silicon-germanium layer 516 and the second silicon layer 520 include a second transition zone 518 disposed therebetween. The width of the transition zones 514, 518 over different lateral positions are graphed in FIG. 6B. As shown in FIG. 6B, the transition width of the first transition zone 514 is about 0.90 nm and the transition width of the second transition zone 518 is about 1.31 nm. In FIG. 6B, an average first transition width line 606 represents the average transition width across the first transition zone 514. An average second transition width line 608 represents the average transition width across the second transition zone 518.

Figure 7:
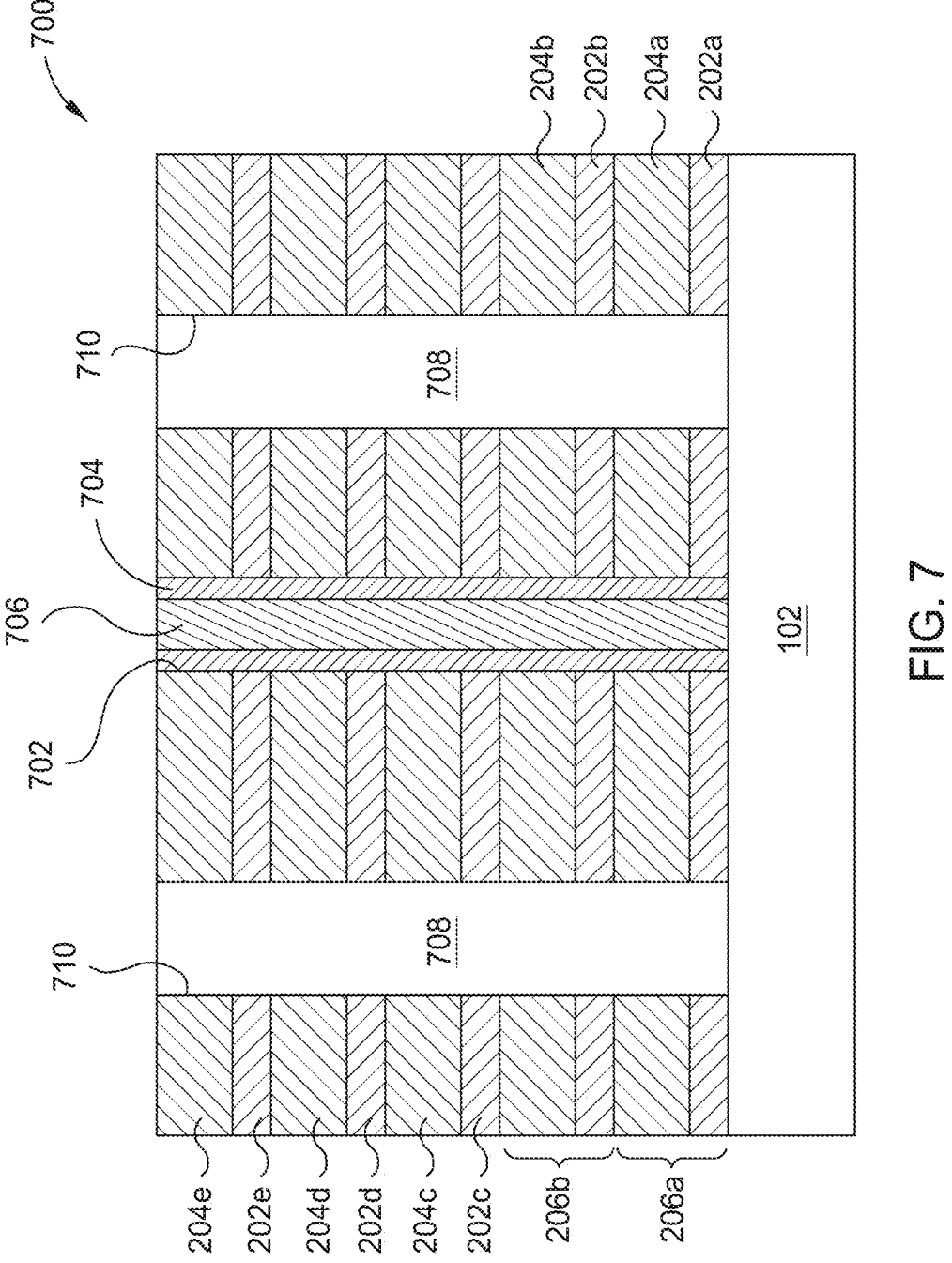
FIG. 7 illustrates a partial device structure of a memory device, according to one embodiment of the disclosure.

FIG. 7 illustrates a partial device structure 700 of a memory device. The partial device structure 700 is formed from the first super-lattice structure 200a. A similar device structure may be formed from a different super-lattice structure, such as the second super-lattice structure 200b. The partial device structure 700 includes a plurality of trenches 708 formed through the layers 202a-202e and 204a-204e of the first super-lattice structure 200a. The trenches include sidewalls 710 which may be etched or treated during later process operations. The partial device structure 700 further includes a plurality of etch holes 702, which may be similar to the trenches 708. However, the etch holes 702 have been filled with one or more of a poly material 704 and an oxide material 706. The poly material 704 may be a polycrystalline silicon material. The oxide material 706 may be a silicon oxide or a silicon nitride. In some embodiments, the oxide material 607 may instead be a silicon-germanium material.

The partial device structure 700 is illustrated herein as an exemplary structure which may be formed from the first super-lattice structure 200a. It is contemplated a variety of device structures may be formed from the super-lattice structures able to be created using the methods described herein.

As described herein, the chemistries and process conditions described herein enable the formation of well-defined interfacial transitions at high growth rates. The growth rate of the silicon-germanium layers may be greater than 200 nm/min. The growth rate of the silicon layers may be greater than 150 nm/min. The layers formed herein have been shown to have few if any defects within the layers and are able to be used with a variety of different stack configurations.

The processes operations described herein may include first removing a native oxide by a pre-clean operation (HF dip or similar) followed by an appropriate bake in an epitaxial deposition chamber. Alternatively, a high temperature bake in the epitaxial deposition chamber may be used without a separate pre-clean operation. Second, an additional surface treatment may be performed in the epitaxial deposition chamber, such as high temperature growth of silicon. Third, the epitaxial deposition chamber is cooled to a deposition temperature of less than or equal to 850° C. Fourth, the epitaxial deposition chamber pressure is adjusted to a deposition pressure of about 1 torr to about 50 torr. Fifth, the temperature and the pressure of the epitaxial deposition chamber is stabilized. Sixth, the process gases are vented to stabilize the process gas flow. Seventh, the appropriate process gases are introduced to the epitaxial deposition chamber to begin growth of the initial layer. The initial layer is a silicon-germanium layer with a germanium concentration of about 12% to about 30%. Additional halogenated species can be included to improve compositional transition between layers. Eighth, the flow of the precursors is adjusted to stop the flow of the silicon-germanium reactive gases or vent the flow of the silicon-germanium reactive gases around the epitaxial deposition chamber. Halogenated species are then flowed if not includes in the previous operation. If halogenated species are included in the previous operation, then increasing the flow rate of the halogenated species during this operation is an option. Note this operation also serves to purge the unwanted species (Ge) from the chamber. Ninth, the silicon layer growth precursors are introduced. Depending on the halogenated species used to improve the layer transition, the halogenated species may remain directed to the chamber, turned off or directed to vent. Tenth, the silicon precursor flow is stopped or the silicon precursor is vented around the chamber. Eleventh, the epitaxial deposition chamber is purged. The purging of the epitaxial deposition chamber may include the introduction of a purge gas, such as helium (He), neon (Ne), or argon (Ar). Operations seven through eleven may be repeated a desired number of times to form a super-lattice structure. Additional SiGe and Si layer with different thicknesses can be added to modify the unit cell to produce different unit cells. After the formation of the super-lattice structure is complete, the substrate is cooled and unloaded from the epitaxial deposition chamber.

While the foregoing is directed to embodiments of the present disclosure, other and further embodiments of the disclosure may be devised without departing from the basic scope thereof, and the scope thereof is determined by the claims that follow.

What is claimed is:

1. A method of forming a semiconductor device, comprising:
   (a) introducing a first silicon containing gas at a first flow rate and a germanium containing gas at a second flow rate into a deposition chamber to form a silicon-germanium layer on a substrate within the deposition chamber;
   (b) stopping the flow of the first silicon containing gas and the germanium containing gas into the deposition chamber after forming the silicon-germanium layer;
   (c) flowing a halogenated species into the deposition chamber; and
   (d) flowing a second silicon containing gas at a third flow rate greater than the first flow rate into the deposition chamber to form a silicon layer on the substrate within the deposition chamber.

2. The method of claim 1, further comprising repeating (a)-(d).

3. The method of claim 2, wherein (a)-(d) are repeated greater than 20 times.

4. The method of claim 1, wherein the halogenated species includes one or a combination of $H_xSiY_{(4-x)}$, $H_xGeY_{(4-x)}$, or HY, where x is equal to an integer between 0-3 and y is equal to one of chlorine (Cl), bromine (Br), or iodine (I).

5. The method of claim 1, wherein (c) is performed between (b) and (d), and flowing the halogenated species is stopped in (d).

6. The method of claim 5, wherein (c) is performed during (a) and (d).

7. The method of claim 1, wherein the silicon-germanium layer and the silicon layer are grown at a growth rate of greater than 150 nm/min.

8. The method of claim 7, wherein (c) is performed between (b) and (d), and the transition width between the silicon-germanium layer and the silicon layer is less than 1.4 nm.

9. The method of claim 1, wherein the silicon-germanium layer comprises 12% to 30% germanium.

10. A method of forming a semiconductor device, comprising:

forming a unit cell comprising:

introducing a silicon containing gas and a germanium containing gas into a deposition chamber to form a silicon-germanium layer on a substrate within the deposition chamber;

stopping the flow of the germanium containing gas into the deposition chamber after forming the silicon-germanium layer;

flowing a halogenated species into the deposition chamber; and forming a silicon layer on the substrate within the deposition chamber from the silicon containing gas, the halogenated species flowing at a first flow rate during the introducing of the silicon containing gas and the germanium containing gas, the first flow rate of the halogenated species is increased to a second flow rate prior to the forming of the silicon layer, and the first flow rate is increased to the second flow rate simultaneously to or after the stopping of the flow of the germanium containing gas; and repeating the forming the unit cell to form a stack of unit cells.

11. The method of claim 10, wherein the repeating the forming the unit cell comprises forming greater than 25 unit cells.

12. The method of claim 10, wherein the halogenated species is introduced during each of the formation of the silicon-germanium layer, the formation of the silicon layer, and between the formation of the silicon-germanium layer and the formation of the silicon layer.

13. The method of claim 10, wherein the silicon layer is disposed directly on the silicon-germanium layer.

14. The method of claim 10, wherein:

the halogenated species is flowed into the deposition chamber during each of formation of the silicon-germanium layer, formation of the silicon layer, and between the formation of the silicon-germanium layer and the silicon layer; and the flow of the halogenated species is reduced from the second flow rate back to the first flow rate for the forming of the silicon layer.

15. The method of claim 10, wherein the halogenated species is flowed into the deposition chamber between the formation of the silicon-germanium layer and the silicon layer, the silicon containing gas flows at a third flow rate during the forming of the silicon-germanium layer, the silicon containing gas continues to flow during the stopping of the flow of the germanium containing gas and during the flowing of the halogenated species, the silicon containing gas flows at a second flow rate during the forming of the silicon layer, and the second flow rate is increased relative to the first flow rate.

16. A super-lattice device structure, comprising:

a first unit cell comprising:

a first silicon-germanium layer; and a first silicon layer disposed on the first silicon-germanium layer, wherein a transition width between the first silicon-germanium layer and the first silicon layer is less than 1.4 nm; and a second unit cell comprising:

a second silicon-germanium layer; and a second silicon layer disposed on the second silicon-germanium layer, wherein the transition width between the second silicon-germanium layer and the second silicon layer is less than 1.4 nm.

17. The super-lattice device structure of claim 16, wherein the silicon-germanium layer includes 12% to 30% germanium.

18. The super-lattice device structure of claim 16, wherein the silicon layer includes less than 1% germanium.

19. The super-lattice device structure of claim 16, wherein each of the first unit cell and the second unit cell further comprise an additional silicon-germanium layer and an additional silicon layer.

20. The super-lattice device structure of claim 16, wherein the first silicon-germanium layer, the second silicon-germanium layer, the first silicon layer, and the second silicon layer have varying thicknesses.

* * * * *